(12) United States Patent
Wright et al.

(10) Patent No.: US 8,035,401 B2
(45) Date of Patent: Oct. 11, 2011

(54) SELF-CALIBRATING DRIVER FOR CHARGING A CAPACITIVE LOAD TO A DESIRED VOLTAGE

(75) Inventors: David Wright, San Diego, CA (US); Jason Muriby, San Diego, CA (US); Erhan Hancioglu, San Diego, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 165 days.

(21) Appl. No.: 11/768,677

(22) Filed: Jun. 26, 2007

(65) Prior Publication Data

US 2008/0258740 A1    Oct. 23, 2008

Related U.S. Application Data

(60) Provisional application No. 60/912,577, filed on Apr. 18, 2007.

(51) Int. Cl.
G01R 27/26 (2006.01)
G01R 35/00 (2006.01)

(52) U.S. Cl. .......................... 324/678; 324/601
(58) Field of Classification Search ............ 324/678
See application file for complete search history.

(56) References Cited

U.S. PATENT DOCUMENTS

| | | |
|---|---|---|
| 4,061,987 A | 12/1977 | Nagahama |
| 4,242,604 A | 12/1980 | Smith |
| 4,272,760 A | 6/1981 | Prazak et al. |
| 4,344,067 A | 8/1982 | Lee |
| 4,684,824 A | 8/1987 | Moberg |
| 4,689,581 A | 8/1987 | Talbot |
| 4,689,740 A | 8/1987 | Moelands et al. |
| 4,692,718 A | 9/1987 | Roza et al. |
| 4,692,760 A | 9/1987 | Unno et al. |
| 4,736,123 A | 4/1988 | Miyazawa et al. |
| 4,797,580 A | 1/1989 | Sunter |
| 4,839,636 A | 6/1989 | Zeiss |
| 4,855,683 A | 8/1989 | Troudet et al. |
| 4,868,525 A | 9/1989 | Dias |
| 4,882,549 A | 11/1989 | Galani et al. |
| 4,947,169 A | 8/1990 | Smith et al. |
| 4,980,653 A | 12/1990 | Shepherd |
| 4,988,983 A | 1/1991 | Wehrer |
| 5,019,729 A | 5/1991 | Kimura et al. |

(Continued)

FOREIGN PATENT DOCUMENTS

EP    1625506 A1    2/2006

(Continued)

OTHER PUBLICATIONS

U.S. Appl. No. 11/965,520: "Active Liquid Crystal Display Drivers and Duty Cycle Operation," Snyder et al., filed on Dec. 27, 2007; 15 pages.

(Continued)

*Primary Examiner* — Jeff Natalini

(57) ABSTRACT

A self-calibration system includes a variable current source to generate a default source current for charging a capacitive load, and a load charge calibrator to detect a voltage associated with the capacitive load when charged by the default source current, and to generate a current control feedback according to the detected voltage and a desired charged voltage of the capacitive load, the current control feedback to indicate to the variable current source a charge current capable of charging the capacitive load to the desired charged voltage.

20 Claims, 3 Drawing Sheets

U.S. PATENT DOCUMENTS

| | | |
|---|---|---|
| 5,036,300 A | 7/1991 | Nicolai |
| 5,073,757 A * | 12/1991 | George ..................... 324/677 |
| 5,095,280 A | 3/1992 | Wunner et al. |
| 5,111,081 A | 5/1992 | Atallah |
| 5,140,197 A | 8/1992 | Grider |
| 5,142,247 A | 8/1992 | Lada, Jr. et al. |
| 5,144,254 A | 9/1992 | Wilke |
| 5,150,079 A | 9/1992 | Williams et al. |
| 5,175,884 A | 12/1992 | Suarez |
| 5,200,751 A | 4/1993 | Smith |
| 5,268,599 A | 12/1993 | Matsui |
| 5,289,138 A | 2/1994 | Wang |
| 5,304,955 A | 4/1994 | Atriss et al. |
| 5,319,370 A | 6/1994 | Signore et al. |
| 5,321,319 A | 6/1994 | Mahmood |
| 5,345,195 A | 9/1994 | Cordoba et al. |
| 5,349,544 A | 9/1994 | Wright et al. |
| 5,355,033 A | 10/1994 | Jang |
| 5,381,116 A | 1/1995 | Nuckolls et al. |
| 5,408,191 A | 4/1995 | Han et al. |
| 5,420,543 A | 5/1995 | Lundberg et al. |
| 5,428,319 A | 6/1995 | Marvin et al. |
| 5,432,665 A | 7/1995 | Hopkins |
| 5,440,305 A | 8/1995 | Signore et al. |
| 5,446,867 A | 8/1995 | Young et al. |
| 5,451,912 A | 9/1995 | Torode |
| 5,473,285 A | 12/1995 | Nuckolls et al. |
| 5,481,179 A | 1/1996 | Keeth |
| 5,495,205 A | 2/1996 | Parker et al. |
| 5,506,875 A | 4/1996 | Nuckolls et al. |
| 5,511,100 A | 4/1996 | Lundberg et al. |
| 5,525,933 A | 6/1996 | Matsuki et al. |
| 5,546,433 A | 8/1996 | Tran et al. |
| 5,552,748 A | 9/1996 | O'Shaughnessy |
| 5,554,942 A | 9/1996 | Herr et al. |
| 5,559,502 A | 9/1996 | Schutte |
| 5,563,553 A | 10/1996 | Jackson |
| 5,565,819 A | 10/1996 | Cooper |
| 5,583,501 A | 12/1996 | Henrion et al. |
| 5,589,783 A | 12/1996 | McClure |
| 5,594,612 A | 1/1997 | Henrion |
| 5,604,466 A | 2/1997 | Dreps et al. |
| 5,608,770 A | 3/1997 | Noguchi et al. |
| 5,610,550 A | 3/1997 | Furutani |
| 5,610,955 A | 3/1997 | Bland |
| 5,614,869 A | 3/1997 | Bland |
| 5,644,254 A | 7/1997 | Boudry |
| 5,666,118 A | 9/1997 | Gersbach |
| 5,668,506 A | 9/1997 | Watanabe et al. |
| 5,670,915 A | 9/1997 | Cooper et al. |
| 5,673,004 A | 9/1997 | Park |
| 5,675,813 A | 10/1997 | Holmdahl |
| 5,682,049 A | 10/1997 | Nguyen |
| 5,684,434 A | 11/1997 | Mann et al. |
| 5,686,863 A | 11/1997 | Whiteside |
| 5,689,196 A | 11/1997 | Schutte |
| 5,699,024 A | 12/1997 | Manlove et al. |
| 5,703,537 A | 12/1997 | Bland et al. |
| 5,703,540 A | 12/1997 | Gazda et al. |
| 5,726,597 A | 3/1998 | Petty et al. |
| 5,729,165 A | 3/1998 | Lou et al. |
| 5,796,312 A | 8/1998 | Hull et al. |
| 5,805,909 A | 9/1998 | Diewald |
| 5,818,370 A | 10/1998 | Sooch et al. |
| 5,825,317 A | 10/1998 | Anderson et al. |
| 5,845,151 A | 12/1998 | Story et al. |
| 5,870,004 A | 2/1999 | Lu |
| 5,870,345 A | 2/1999 | Stecker |
| 5,872,464 A | 2/1999 | Gradinariu |
| 5,877,656 A | 3/1999 | Mann et al. |
| 5,898,345 A | 4/1999 | Namura et al. |
| 5,949,408 A | 9/1999 | Kang et al. |
| 6,040,707 A | 3/2000 | Young et al. |
| 6,157,266 A | 12/2000 | Tsai et al. |
| 6,191,660 B1 | 2/2001 | Mar et al. |
| 6,199,969 B1 * | 3/2001 | Haflinger et al. .......... 347/19 |
| 6,211,739 B1 | 4/2001 | Synder et al. |
| 6,215,835 B1 | 4/2001 | Kyles |
| 6,219,736 B1 | 4/2001 | Klingman |
| 6,225,992 B1 | 5/2001 | Hsu et al. |
| 6,266,715 B1 | 7/2001 | Loyer et al. |
| 6,294,962 B1 | 9/2001 | Mar |
| 6,297,705 B1 | 10/2001 | Williams et al. |
| 6,357,011 B2 | 3/2002 | Gilbert |
| 6,407,641 B1 | 6/2002 | Williams et al. |
| 6,433,645 B1 | 8/2002 | Mann et al. |
| 6,466,036 B1 * | 10/2002 | Philipp ..................... 324/678 |
| 6,515,551 B1 | 2/2003 | Mar et al. |
| 6,525,616 B1 | 2/2003 | Williams et al. |
| 6,646,514 B2 * | 11/2003 | Sutliff et al. ............... 331/173 |
| 6,708,233 B1 | 3/2004 | Fuller et al. |
| 6,708,247 B1 | 3/2004 | Barret et al. |
| 6,742,076 B2 | 5/2004 | Wang et al. |
| 6,753,739 B1 | 6/2004 | Mar et al. |
| 6,807,109 B2 | 10/2004 | Tomishima |
| 6,946,920 B1 | 9/2005 | Williams et al. |
| 6,960,953 B2 | 11/2005 | Ichihara |
| 7,170,257 B2 | 1/2007 | Oh |
| 7,212,183 B2 | 5/2007 | Tobita |
| 7,276,977 B2 * | 10/2007 | Self ........................... 331/11 |
| 7,375,593 B2 * | 5/2008 | Self ........................... 331/16 |
| 7,446,747 B2 | 11/2008 | Youngblood et al. |
| 7,600,156 B2 | 10/2009 | Thornley et al. |
| 7,631,111 B2 | 12/2009 | Monks et al. |
| 2003/0122734 A1 | 7/2003 | Chien et al. |
| 2004/0070559 A1 | 4/2004 | Liang |
| 2004/0124854 A1 * | 7/2004 | Slezak ........................ 324/644 |
| 2004/0189573 A1 | 9/2004 | Lee et al. |
| 2005/0007125 A1 * | 1/2005 | Heger ........................ 324/662 |
| 2005/0052394 A1 | 3/2005 | Waterman |
| 2006/0022720 A1 * | 2/2006 | Wood ......................... 327/94 |
| 2006/0033474 A1 | 2/2006 | Shum |
| 2006/0239746 A1 | 10/2006 | Grant |
| 2006/0244739 A1 | 11/2006 | Tsai |
| 2007/0029975 A1 | 2/2007 | Martin et al. |
| 2007/0159425 A1 | 7/2007 | Knepper et al. |
| 2008/0258740 A1 | 10/2008 | Wright et al. |
| 2008/0258797 A1 | 10/2008 | Wright et al. |
| 2008/0259017 A1 | 10/2008 | Wright et al. |
| 2008/0259065 A1 | 10/2008 | Wright et al. |
| 2008/0259070 A1 | 10/2008 | Snyder et al. |
| 2008/0263243 A1 | 10/2008 | Wright et al. |
| 2008/0263260 A1 | 10/2008 | Snyder et al. |

FOREIGN PATENT DOCUMENTS

| | | |
|---|---|---|
| JP | 287113 A1 | 11/1988 |
| JP | 291161 A1 | 11/1990 |
| JP | 297223 A1 | 12/1991 |
| WO | WO 89/06456 A1 | 7/1989 |
| WO | PCT/IB95/00975 A1 | 6/1996 |
| WO | WO 97/36230 A1 | 10/1997 |
| WO | PCT/IB98/0041 A1 | 8/1998 |
| WO | PCT/US99/09712 A1 | 2/1999 |

OTHER PUBLICATIONS

International Search Report for International Application PCT/US08/60699 mailed Jun. 18, 2009; 2 pages.

The Written Opinion of the International Searching Authority for International Application PCT/US08/60699 mailed Jun. 18, 2009; 4 pages.

U.S. Appl. No. 11/864,137: "Configurable Liquid Crystal Display Driver System," Wright et al., filed on Sep. 28, 2007; 12 pages.

U.S. Appl. No. 11/855,281: "Reducng Power Consumpton in a Liquid Crystal Display," Wright et al., filed on Sep. 14, 2007; 13 pages.

U.S. Appl. No. 11/843,216: "Non-Resistive Load Driver," Wright et al., filed on Aug. 22, 2007; 10 pages.

USPTO Notice of Allowance for U.S. Appl. No. 11/843,216 dated Feb. 22, 2010; 6 pages.

USPTO Non-Final Rejection for U.S. Appl. No. 11/843,216 dated Oct. 6, 2009; 7 pages.

Kim et al., "Low-Power High-Slew-Rate CMOS Buffer Amplifier for Flat Panel Display Drivers," Electronic Letters, Feb. 16, 2006, vol. 42, No. 4, <http://circuit.kaistac.kr/upload_files.pdf>; 2 pages.

USPTO Notice of Allowance for U.S. Appl. No. 09/275,336 dated Sep. 27, 2000; 1 page.

USPTO Non-Final Rejection for U.S. Appl. No. 10/339,115 dated Oct. 2, 2003; 3 pages.
USPTO Non-Final Rejection for U.S. Appl. No. 10/339,115 dated Jan. 28, 2004; 4 pages.
USPTO Final Rejection for Application No. 10/339,115 dated Jun. 24, 2004; 5 pages.
U.S. Appl. No. 11/965,485: "Display Interface Buffer," Snyder et al., filed on Dec. 27, 2007; 16 pages.
U.S. Appl. No. 11/857,970: "Specialized Universal Serial Bus Controller," Wright et al., filed on Sep. 19, 2007; 12 pages.
USPTO Non-Final Rejection for U.S. Appl. No. 11/857,970 dated Mar. 10, 2010: 26 pages.
USPTO Final Rejection for U.S. Appl. No. 11/857,970 dated Aug. 19, 2009; 22 pages.
USPTO Non-Final Rejection for U.S. Appl. No. 11/857,970 dated Mar. 18, 2009; 21 pages.
International Search Report for International Application PCT/US08/60702 mailed Sep. 3, 2008; 2 pages.
The Written Opinion of the International Searching Authority for International Application PCT/US08/60702 mailed Sep. 3, 2008; 4 pages.
Jan Axelson, "USB Complete: Everything You Need to Develop USB Peripherals," 3rd Edition, Copyright 1999-2005, ISBN 978-1-931448-03-1, pp. 51-59, 85-91, 225; 20 pages.
USPTO Notice of Allowance for U.S. Appl. No. 09/511,019 dated Jan. 4, 2002; 4 pages.
USPTO Final Rejection for U.S. Appl. No. 09/511,019 dated Nov. 29, 2001; 5 pages.
USPTO Non-Final Rejection for U.S. Appl. No. 09/511,019 dated May 4, 2001; 5 pages.
CY7C63722/23 CY7C63742/43 enCoRe USB Combination Low-Speed USB & PS/2 Peripheral Controller, Cypress Semiconductor Corporation, Revised May 2000; 48 pages.
CY7C63221/31 enCoRe USB Low-Speed USB Peripheral Controller, Cypress Semiconductor Corporation, Revised May 2000; 40 pages.
Sam Yinshang Sun, "An Analog PLL-Based Clock and Data Recovery Circuit with High Input Jitter Tolerance," Reprinted from IEEE Journal of Solid-State Circuits, vol. SC-24, pp. 325-330, Apr. 1989, pp. 383-385; 4 pages.
Robert A. Blauschild "WP 3.5:An Integrated Time Reference," ISSCC94/Session 3, Analog Techniques/Paper WP 3.5, Feb. 1994, pp. 56-58; 4 pages.
Beomsup et al., "A 30-MHz Hybrid Analog/Digital Clock Recovery Circuit in 2-um CMOS," IEEE Journal of Solid-State Circuits, vol. 25, No. 6, Dec. 1990, pp. 1385-1394; 10 pages.
Bakker et al., "Micropower CMOS Temperature Sensor with Digital Output," IEEE, Jul. 1996; 3 pages.
USPTO Notice of Allowance for U.S. Appl. No. 08/868,079 dated Nov. 14, 2000; 3 pages.
USPTO Final Rejection for U.S. Appl. No. 08/868,079 dated Sep. 20, 2000; 4 pages.
USPTO Non-Final Rejection for U.S. Appl. No. 08/868,079 dated Apr. 12, 2000; 6 pages.
USPTO Final Rejection for U.S. Appl. No. 08/868,079 dated Dec. 17, 1999; 7 pages.
USPTO Non-Final Rejection for U.S. Appl. No. 08/868,079 dated Jul. 1, 1999; 6 pages.
USPTO Advisory Action for U.S. Appl. No. 08/868,079 dated Mar. 26, 1999; 2 pages.
USPTO Final Rejection for U.S. Appl. No. 08/868,079 dated Jan. 27, 1999; 7 pages.
USPTO Non-Final Rejection for U.S. Appl. No. 08/868,079 dated Jan. 22, 1998; 7 pages.
"Universal Serial Bus Specification," Revision 1.0, Chapter 7, Jan. 1996, pp. 111-143; 34 pages.
USPTO Notice of Allowance for U.S. Appl. No. 09/511,020 dated May 2, 2001; 1 page.
USPTO Non-Final Rejection for U.S. Appl. No. 09/511,020 dated Nov. 28, 2000; 4 pages.
USPTO Notice of Allowance for U.S. Appl. No. 09/966,626 dated Oct. 10, 2002; 8 pages.
USPTO Final Rejection for U.S. Appl. No. 09/966,626 dated Jun. 26, 2002; 5 pages.
USPTO Non-Final Rejection for U.S. Appl. No. 09/966,626 dated Dec. 6, 2001; 6 pages.
USPTO Notice of Allowance for U.S. Appl. No. 10/339,115 dated Jan. 28, 2005; 6 pages.
USPTO Advisory Action for U.S. Appl. No. 10/339,115 dated Jul. 29, 2004; 3 pages.
Cacharelis et al., "A Fully Modular Modular 1 um CMOS Technology Incorporating EEPROM, EPROM and Interpoly Capacitors," 20th European Solid State Device Research Conference, Nottingham, Sep. 1990, pp. 547-550; 4 pages.
USPTO Final Rejection for U.S. Appl. No. 09/275,336 dated Aug. 31, 2000; 5 pages.
USPTO Non-Final Rejection for U.S. Appl. No. 09/275,336 dated Apr. 21, 2000; 6 pages.
USPTO Notice of Allowance for U.S. Appl. No. 09/721,316 dated Sep. 23, 2002; 5 pages.
USPTO Final Rejection for U.S. Appl. No. 09/721,316 dated May 3, 2002; 5 pages.
USPTO Non-Final Rejection for U.S. Appl. No. 09/721,316 dated Aug. 7, 2001; 3 pages.
USPTO Non-Final Rejection for U.S. Appl. No. 09/721,316 dated Apr. 24, 2001; 4 pages.
USPTO Notice of Allowance for U.S. Appl. No. 10/324,455 dated Feb. 12, 2004; 4 pages.
USPTO Non-Final Rejection for U.S. Appl. No. 10/324,455 dated Nov. 6, 2003; 4 pages.
USPTO Non-Final Rejection for U.S. Appl. No. 10/324,455 dated Aug. 21, 2003; 4 pages.
USPTO Notice of Allowance for U.S. Appl. No. 09/207,912 dated May 7, 2001; 3 pages.
USPTO Non-Final Rejection for U.S. Appl. No. 09/207,912 dated Jan. 26, 2001; 4 pages.
USPTO Advisory Action for U.S. Appl. No. 09/207,912 dated Dec. 22, 2000; 1 page.
USPTO Final Rejection for U.S. Appl. No. 09/207,912 dated Oct. 11, 2000; 5 pages.
USPTO Non-Final Rejection for U.S. Appl. No. 09/207,912 dated Apr. 19, 2000; 5 pages.
USPTO Non-Final Rejection for U.S. Appl. No. 09/207,912 dated Nov. 10, 1999; 6 pages.
USPTO Notice of Allowance for U.S. Appl. No. 08/549,915 dated Apr. 8, 1997; 3 pages.
USPTO Non-Final Rejection for U.S. Appl. No. 08/549,915 dated May 24, 1996; 3 pages.
USPTO Notice of Allowance for U.S. Appl. No. 08/696,008 dated Sep. 22, 1998; 4 pages.
USPTO Non-Final Rejection for U.S. Appl. No. 08/696,008 dated Apr. 6, 1998; 12 pages.
USPTO Non-Final Rejection for U.S. Appl. No. 08/696,008 dated Oct. 3, 1997; 3 pages.
S.M. Sze, "Physics of Semiconductor Devices," 2nd Edition, John Wiley & Sons, New York, 1981, pp. 496-506; 13 pages.
USPTO Notice of Allowance for U.S. Appl. No. 08/865,342 dated Sep. 16, 1998; 1 page.
USPTO Non-Final Rejection for U.S. Appl. No. 08/865,342 dated Apr. 8, 1998; 5 pages.
USPTO Non-Final Rejection for U.S. Appl. No. 08/865,342 dated Feb. 3, 1998; 3 pages.
USPTO Notice of Allowance for U.S. Appl. No. 09/048,905 dated May 29, 2002; 4 pages.
USPTO Final Rejection for U.S. Appl. No. 09/048,905 dated Feb. 8, 2002; 6 pages.
USPTO Non-Final Rejection for U.S. Appl. No. 09/048,905 dated Feb. 8, 2002; 10 pages.
USPTO Non-Final Rejection for U.S. Appl. No. 09/048,905 dated Feb. 15, 2001; 12 pages.
USPTO Non-Final Rejection for U.S. Appl. No. 09/048,905 dated Aug. 22, 2000; 12 pages.
USPTO Final Rejection for U.S. Appl. No. 09/048,905 dated Oct. 15, 1999; 8 pages.

USPTO Non-Final Rejection for U.S. Appl. No. 09/048,905 dated Jun. 3, 1999; 5 pages.

Cuppens et al., "An EEPROM for Micropocessors and Custom Logic," IEEE Journal of Solid-State Circuits, vol. SC-20, No. 2, Apr. 1985, pp. 603-608; 6 pages.

Electronic Engineering Times, "TI's Quantum Leap," Issue 517, Dec. 19, 1988, pp. 1 and 86; 2 pages.

Kazerounian et al., "A Single Poly EPROM for Custom CMOS Logic Applications," IEEE 1986 Custom Integrated Circuits Conference, 1986, pp. 59-62; 4 pages.

Takebuchi et al., "A Novel Integration Technology of EEPROM Embedded CMOS LOGIC VLSI Suitable for ASIC Applications," IEEE 1992 Custom Integrated Circuits Conference, 1992, pp. 9.6.1-9.6.4; 4 pages.

Cacharelis et al., "A Modular 1 um CMOS Single Polysilicon EPROM PLD Technology," Aug. 1988 IEEE, pp. 60-IEDM 88 to 63-IEDM 88; 4 pages.

Ohsaki et al., "A Planar Type EEPROM Cell Structure by Standard CMOS Process and Applications," VLSI Technology, Digest of Technical Papers, May 1993, pp. 55-66; 2 pages.

Ohsaki et al., "A Planar Type EEPROM Cell Structure by Standard CMOS Process for Integration with Gate Array, Standard Cell, Microprocessor and for Neural Chips," IEEE 1993 Custom Integrated Circuits Conference, 1993, pp. 23.6.1-23.6.4; 4 pages.

Ohsaki et al., "SIPPOS (Single Poly Pure CMOS) EEPROM Embedded FPGA by News Ring Interconnection and Highway Path," IEEE 1994 Custom Integrated Circuits Conference, 1994, pp. 189-192; 4 pages.

Ohsaki et al., "A Single Poly EEPROM Cell Structure for Use in Standard CMOS Processes," IEEE Journal of Solid-State Circuits, vol. 29, No. 3, Mar. 1994, pp. 311-316; 6 pages.

Miyamoto et al., "An Experimental 5-V-Only 256-kbit CMOS EEPROM with a High-Performance Single-Polysilicon Cell," IEEE Journal of Solid State Circuits, vol. SC-21, No. 5, Oct. 1986, pp. 852-860; 9 pages.

Yoshikawa et al., "An EPROM Cell Structure for EPLD's Compatible with Single Poly-Si Gate Processes," IEEE Transactions on Electron Devices, vol. 37, No. 3, Mar. 1990, pp. 675-679; 5 pages.

USPTO Notice of Allowance for U.S. Appl. No. 08/259,323 dated Mar. 21, 1995; 1 page.

USPTO Non-Final Rejection for U.S. Appl. No. 08/259,323 dated Oct. 6, 1994; 7 pages.

T.J. Giles, "A University Frequency Synthesizer IC," Aug. 1979, Philips Telecommunication Review, vol. 37, No. 3, pp. 177-181; 6 pages.

Cypress Semiconductor Marketing Brochure, "Timing Technology Products," Published Nov. 1993, a publication of Cypress Semiconductor in San Jose, CA, pp. 5-7; 5 pages.

Hoe et al., "Cell and Circuit Design for Single-Poly EPROM," IEEE Journal of Solid-State Circuits, vol. 24, No. 4, Aug. 1989, pp. 1153-1157; 5 pages.

L. Richard Carley, "Trimming Analog Circuits Using Floating-Gate Analog MOS Memory," IEEE Journal of Solid-State Circuits, vol. 24, No. 6, Dec. 1989, pp. 1569-1575; 7 pages.

Frake et al., "A 9ns, Low Standby Power CMOS PLD with a Single-Poly EPROM Cell," 1989 IEEE International Solid-State Circuits Conference, Feb. 17, 1989, pp. 230-231 and 346; 3 pages.

Sugino et al., "Analysis of Writing and Erasing Procedure of Flotox EEPROM Using the New Charge Balance Condition (CBC) Model," NUPAD IV, May and Jun. 1992, pp. 65-69; 5 pages.

USPTO Non-Final Rejection for U.S. Appl. No. 11/864,137 dated Jul. 7, 2010; 9 pages.

USPTO Non-Final Rejection for U.S. Appl. No. 11/855,281 dated Jul. 1, 2010; 10 pages.

USPTO Final Rejection for U.S. Appl. No. 11/857,970 dated Sep. 1, 2010; 29 pages.

USPTO Non-Final Rejection for U.S. Appl. No. 09/048,905 dated Jul. 24, 2001; 10 pages.

USPTO Non-Final Rejection for U.S. Appl. No. 11/965,520 dated Sep. 29, 2010; 11 pages.

USPTO Non-Final Rejection for U.S. Appl. No. 11/864,137 dated Oct. 29, 2010; 10 pages.

USPTO Final Rejection for U.S. Appl. No. 11/855,281 dated Dec. 16, 2010; 13 pages.

USPTO Non-Final Rejection for U.S. Appl. No. 11/965,485 dated Oct. 1, 2010; 12 pages.

USPTO Advisory Action for U.S. Appl. No. 11/857,970 dated Jan. 6, 2011; 2 pages.

USPTO Final Rejection for U.S. Appl. No. 11/857,970 dated Oct. 22, 2010; 24 pages.

USPTO Final Rejection for U.S. Appl. No. 11/864,137 dated Apr. 12, 2011; 12 pages.

USPTO Advisory Action for U.S. Appl. No. 11/855,281 dated Mar. 3, 2011; 4 pages.

USPTO Final Rejection for U.S. Appl. No. 11/965,485 dated Apr. 13, 2011; 15 pages.

USPTO Non-Final Rejection for U.S. Appl. No. 11/857,970 dated Mar. 7, 2011; 32 pages.

* cited by examiner ly to charge the capacitive load to the desired voltage level. The electronic circuits perform this process iteratively until the voltage across the capacitive load corresponds to the desired voltage level. Although these systems can charge their capacitive loads to the desired voltage level, it often takes many iterations to accomplish, which is both time-consuming and a waste of system resources.

SELF-CALIBRATING DRIVER FOR CHARGING A CAPACITIVE LOAD TO A DESIRED VOLTAGE

RELATED APPLICATIONS

This application claims priority from U.S. Provisional Application No. 60/912,577, filed Apr. 18, 2007, which is incorporated herein by reference.

FIELD OF THE INVENTION

The present disclosure relates generally to electrical circuits, and more particularly to a self-calibrating driver.

BACKGROUND

The operation of many electronic circuits includes charging capacitive loads to a desired voltage level. To calibrate this capacitive load charging, these electronic circuits often perform an iterative process of charging the capacitive loads and then comparing the resulting voltage of the charge capacitive load to the desired voltage level. For instance, during load charge calibration an electronic circuit charges a capacitive load, checks the resulting voltage across the capacitive load, and then recharges the capacitive load in an attempt to more closely charge the capacitive load to the desired voltage level.

DESCRIPTION OF THE DRAWINGS

The invention may be best understood by reading the disclosure with reference to the drawings.

DETAILED DESCRIPTION

Figure 1:
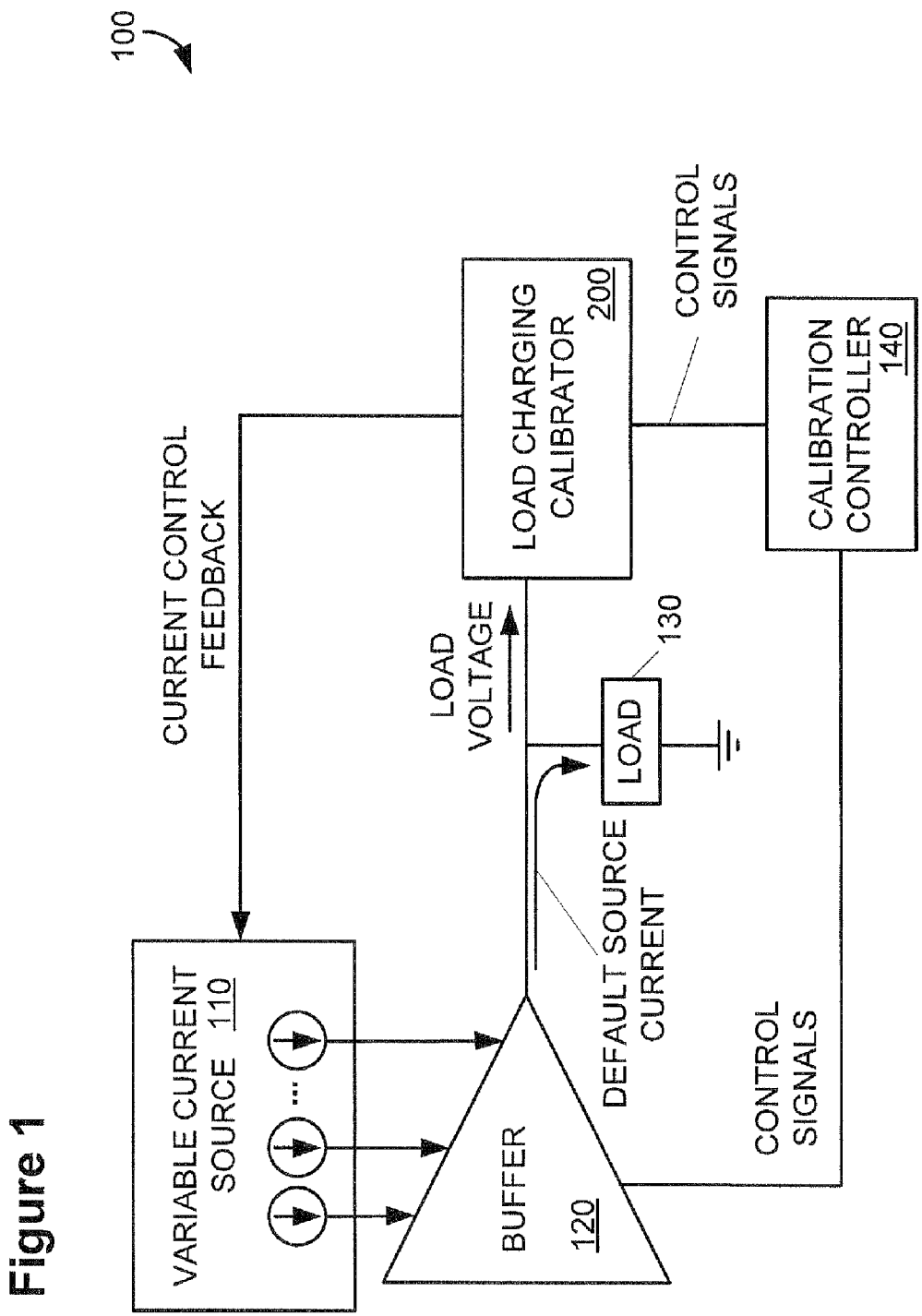
FIG. 1 is a block diagram of a self-calibrating driver according to embodiments of the invention.

FIG. 1 is a block diagram of a self-calibrating driver 100 according to embodiments of the invention. Referring to FIG. 1, the self-calibrating driver 100 is capable of performing a one-time self-calibration for charging a capacitive load 130 to a desired voltage level. This self-calibration may be performed during a preset period of time and without knowledge of a capacitance associated with the capacitive load 130.

The self-calibrating driver 100 includes a variable current source 110 to generate one or more source currents and to provide them to a buffer 120 for subsequent charging of the capacitive load 130. The variable current source 110 may include multiple fixed-current sources, each to generate a fixed current when directed by the variable current source 110. For instance, the variable current source 110 may have 5 current sources that supply currents of 10 micro-Amps (uA), 20 uA, 40 uA, 80 uA, and 160 uA, respectively. Thus, when the variable current source 110 is to generate a current of 120 uA, the 40 uA and 80 uA current sources may be activated to provide 120 uA of current to the buffer 120. Although the above-example embodiment shows 5 current sources capable of generating currents with different magnitudes, the variable current source 110 may include any number of current sources capable of generating any magnitude of current.

During self-calibration, the variable current source 110 may generate one or more default source currents and provide them to the buffer 120. The buffer 120 may provide the default source current to the capacitive load 130 for a preset time period to charge the capacitive load 130. Since over-charging the capacitive load 130, for example, by providing too much current, may result in damage to the capacitive load 130, in some embodiments, the variable current source 110 sets the default source current to a low level, such as the minimum amount of current the variable current source 110 is capable of generating.

The self-calibrating driver 100 includes a load charging calibrator 200 to detect a voltage associated with the capacitive load 130 when charged by the default source current, and to generate a current control feedback responsive to the detected voltage. The current control feedback may indicate a source current that is capable of charging the capacitive load 130 to the desired voltage during the preset time period. In some embodiments, the load charging calibrator 200 may compare the detected voltage with a desired voltage for a charge capacitive load 130, and generate the current control feedback responsive to the comparison.

The load charging calibrator 200 may provide the current control feedback to the variable current source 110 for generation of a source current capable of charging the capacitive load 130 to the desired voltage level in the preset period of time. Thus, the self-calibrating driver 100 may generate a source current that can charge the capacitive load 130 to a desired voltage level during the preset time period without knowing the capacitance associated with the capacitive load 130. Embodiments of the load charging calibrator 200 will be described later in greater detail.

The self-calibrating driver 100 includes a calibration controller 140 to coordinate self-calibrating operations for the self-calibrating driver 100. The calibration controller 140 may store a preset time period that the capacitive load 130 may be charged by the default source current, and a desired voltage level for a charged capacitive load 130. The preset period of time and desired voltage may be input into the calibration controller 140 through a user-interface (not shown), or received from other device (not shown) coupled to the self-calibrating driver 100. In some embodiments, the calibration controller 140 may be programmed with the preset period of time to optimize power consumption and system efficiency, or to reduce a delay caused by the self-calibration.

During self-calibration, the calibration controller 140 may prompt the buffer 120 to charge the capacitive load 130 with the default source current generated by the variable current source 110. The calibration controller 140 may enable and disable the buffer 120 to provide the default source current to the capacitive load 130 according to the preset time period. For instance, the calibration controller 140 may include a counter that is initiated when the buffer 120 is enabled to provide the default source current to the capacitive load 130, where the calibration controller 140 disables the buffer 120 once the preset period of time has elapsed. In some embodiments, the calibration controller 140 may provide the preset time period directly to the buffer 120 as an indicator of the length of time that the buffer 120 is to provide the default source current to the capacitive load 130 during charging.

The calibration controller 140 may prompt the load charge calibrator 200 to detect the voltage associated with the charged capacitive load 130 and generate the current control feedback to indicate the magnitude of source current the variable current source 110 should generate to charge the capacitive load 130 to the desired voltage level. The calibration controller 140 may also direct the variable current source 110 to generate the default source current, for example, through the load charge calibrator 200.

Figure 2:
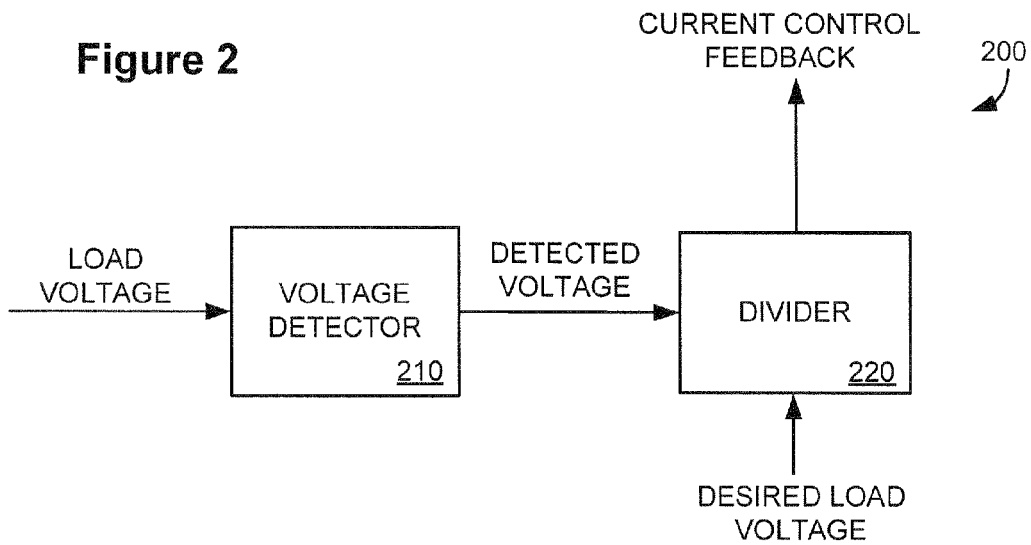
FIG. 2 is a block diagram illustrating embodiments of the load charging calibrator shown in FIG. 1.

FIG. 2 is a block diagram illustrating embodiments of the load charging calibrator shown in FIG. 1. Referring to FIG. 2, the load charging calibrator 200 includes a voltage detector 210 to detect a voltage level associated with the capacitive load 130 and provide the detected voltage to a divider 220. For instance, after the capacitive load 130 is charged by the default source current, the voltage detector 210 may detect the voltage corresponding to the charged capacitive load 130. In some embodiments, the calibration controller 140 may prompt the voltage detector 210 to detect the voltage level associated with the capacitive load 130.

The voltage detector 210 may be an analog-to-digital converter that detects a voltage level associated with the charged capacitive load 130 and convert the analog voltage detection into a digital representation of the detected voltage. In some embodiments, the digital representation of the detected load voltage may have the same number of bits as the number of current sources in the variable current source 110.

The divider 220 may divide the desired voltage level with the detected voltage level from the voltage detector 210 to determine a source current ratio. This source current ratio may indicate a multiple of the default source current that will charge the capacitive load 130 to the desired voltage level in the preset period of time. For instance, when the default current is 10 uA and the source current ratio is 4, the variable current source 110 may generate a new 40 uA source current to charge the capacitive load 130 to the desired voltage level in the preset period of time.

The divider 220 may provide the source current ratio to the variable current source 110 as the current control feedback. In some embodiments, the load charging calibrator 200 may determine a capacitance value associated with the capacitive load 130 to determine the current needed to charge the capacitive load 130 to the desired voltage level in the preset period of time.

An example calibration operation for the self-calibrating driver 100 will now be described in greater detail. In this example, the desired voltage level for the capacitive load is 3 Volts (V) and the preset time period is 25 micro-second (us). The variable current source 110 may have 5-bit controllability, each bit corresponding a different current source in the variable current source 110. The current sources may produce current with magnitudes of 10 uA, 20 uA, 40 uA, 80 uA, and 160 uA, respectively.

Upon initiation of self-calibration, the variable current source 110 may generate a default source current, for example, of 10 uA according to a binary code of "10000", and provide the default source current to the buffer 120. The buffer 120 may charge of the capacitive load 130 with the default source current of 10 uA for the preset time period of 25 us. The capacitive load 130 may be charged according to the following equation:

$$V_{LOAD} = \frac{I_{DEFAULT} * t_{CHARGING}}{C_{LOAD}} \quad \text{Equation 1}$$

The $V_{LOAD}$ is the voltage across the capacitive load 130, the $I_{DEFAULT}$ is the default source current, the $t_{CHARGING}$ is the preset period of time, and the $C_{LOAD}$ is capacitance of the capacitive load 130. Thus, when the capacitance $C_{LOAD}$ of the capacitive load 130 is equal to 1 nano-Farad (nF), the voltage $V_{LOAD}$ across the capacitive load 130 is 0.25 Volts.

The load charging calibrator 200 detects that the voltage across the capacitive load 130 is 0.25 Volts. The load charging calibrator 200 may compare the detected voltage of 0.25V to the desired voltage of 3 Volts and generate the current control feedback according to the comparison. Since the capacitive load 130 may be slew-rate limited, where the load voltage is linearly related to the charging current, the load charging calibrator 200 may utilize a voltage ratio for this comparison and divide the desired voltage of 3 Volts with the detected voltage of 0.25V as shown in the following equation:

$$CurrentControlFeedback = \frac{V_{DESIRED}}{V_{DETECTED}} \quad \text{Equation 2}$$

In this case, the current control feedback will indicate a ratio of 12 or binary code of "01100", which is the result of dividing 3V by 0.25V. The ratio of 12 indicates that the variable current source 110 needs to provide 12 times the current, or 120 uA, in order to charge the capacitive load 130 to the desired voltage of 3 Volts in the preset time period of 25 us.

The load charging calibrator 200 may provide the binary code "01100" to the variable current source 110, which may apply a flipped version of the binary code "00110" and activates the 40 uA current source and the 80 uA current source, for a total source current output of 120 uA. In some embodiments, the load charging calibrator 200 may flip the binary code prior to providing it to the variable current source 110.

In some embodiments, the load charging calibrator 200 may determine the capacitance $C_{LOAD}$ of the capacitive load 130 from the detected voltage using Equation 1, and then calculate a new source current from the capacitance $C_{LOAD}$ of the capacitive load 130, the preset time period $t_{CHARGING}$, and the desired voltage of 3 Volts, where the new source current can charge the capacitive load 130 to the desired voltage level (3 Volts) in the preset time period of 25 us.

Figure 3:
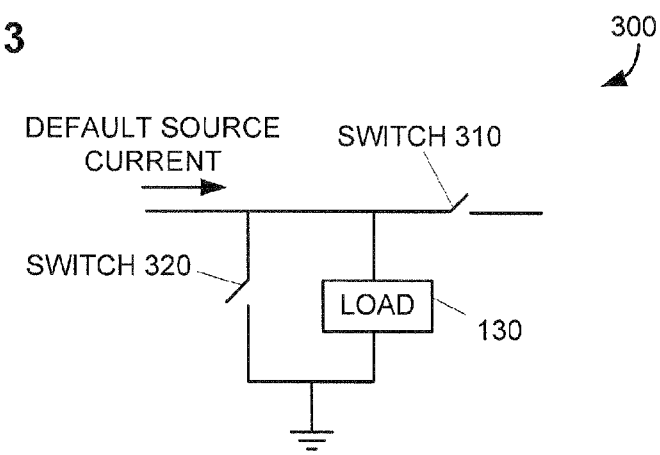
FIG. 3 is a block diagram of embodiments of the load coupling shown in FIG. 1.

FIG. 3 is a block diagram of embodiments of the load coupling shown in FIG. 1. Referring to FIG. 3, the self-calibrating driver 100 may include a plurality of switches 310 and 320 to facilitate calibration operations. The switch 310 may be coupled between the buffer 120 and the load charging calibrator 200. When the buffer 120 is charging the capacitive load 130, switch 310 may be open, preventing current from the buffer 120 to be drawn into the load charging calibrator 200. When the switch 310 is closed, however, the load charging calibrator 200 may detect the voltage associated with the charged capacitive load 130.

The switch 320 may be coupled in parallel with the capacitive load 130, between the buffer 120 and a ground, and may remain open during calibration operations by the buffer 120 and the load charging calibrator 200. After the buffer 120 charges the capacitive load 130 and the load charging calibrator 200 detects the voltage associated with the charged capacitive load 130, the switch 320 may be closed to discharge the capacitive load 130 of voltage received during the calibration process.

Figure 4:
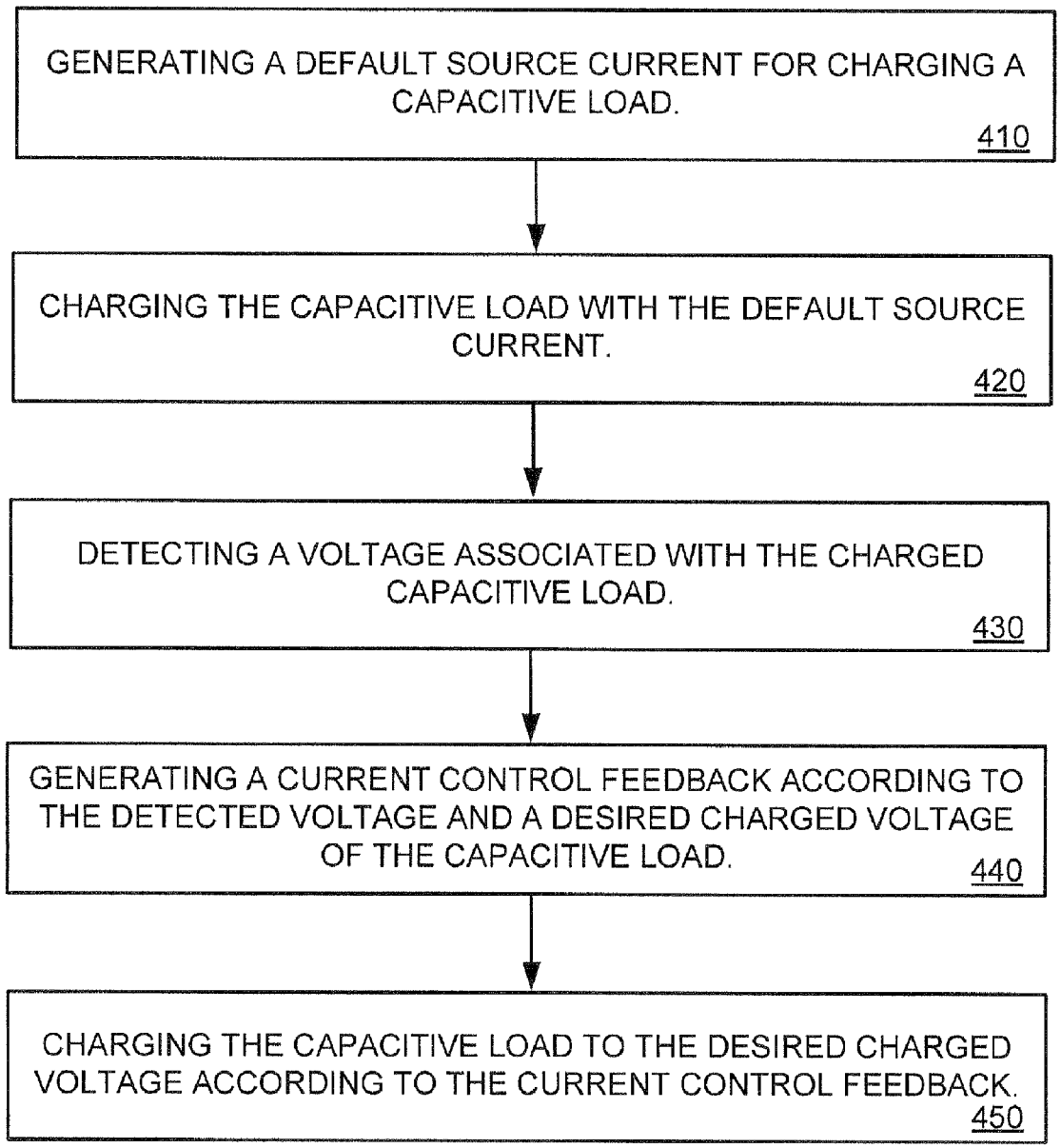
FIG. 4 is an example flowchart of the self-calibrating driver shown in FIG. 1.

FIG. 4 is an example flowchart of the self-calibrating driver shown in FIG. 1. Referring to FIG. 4, in a block 410, the self-calibrating driver 100 generates a default source current for charging a capacitive load 130. The self-calibrating driver 100 may include a variable current source 110 for generating the default source current. The variable current source 110 may include multiple fixed-current sources, each to generate a fixed current when directed by the variable current source 110. For instance, the variable current source 110 may have 5 current sources that supply currents of 10 micro-Amps (uA), 20 uA, 40 uA, 80 uA, and 160 uA, respectively.

In a block 420, the self-calibrating driver 100 charges the capacitive load 130 with the default source current. The self-calibrating driver 100 includes a buffer 120 that receives the default source current from the variable current source 110 and provides the default source current to charge the capacitive load 130.

In a block 430, the self-calibrating driver 100 detects a voltage associated with the charged capacitive load 130. The self-calibrating driver 100 includes a voltage detector 210 to detect the voltage across the capacitive load 130 after charged by the default source current. In some embodiments, the voltage detector 210 may be an analog-to-digital converter that detects a voltage level associated with the charged capacitive load 130 and convert the analog voltage detection into a digital representation of the detected voltage.

In a block 440, the self-calibrating driver 100 generates a current control feedback according to the detected voltage and a desired charged voltage of the capacitive load. The current control feedback may indicate to the variable current source 110 a charge current capable of charging the capacitive load 130 to the desired charged voltage.

The self-calibrating driver 100 includes a load charging calibrator 200 to compare the detected voltage to the desired voltage and to generate the current control feedback according to the comparison. Since the capacitive load 130 may be slew-rate limited, where the load voltage is linearly related to the charging current, the load charging calibrator 200 may utilize a voltage ratio for this comparison and divide the desired voltage with the detected voltage. For instance, when the current control feedback indicates a ratio of 6, the variable current source 110 is prompted to provide a source current that is 6 times the default source current in order to charge the capacitive load 130 to the desired voltage in the preset time period. In a block 450, the self-calibrating driver 100 charges the capacitive load to the desired charged voltage according to the current control feedback. The variable current source 110 may generate a new source current according to the current control feedback that will charge the capacitive load 130 to the desired voltage in the preset time period. This calibration process that allows the self-calibrating driver 100 charge the capacitive load 130 to the desired voltage in the preset time period may be performed without knowing the capacitance of the capacitive load 130.

One of skill in the art will recognize that the concepts taught herein can be tailored to a particular application in many other advantageous ways. In particular, those skilled in the art will recognize that the illustrated embodiments are but one of many alternative implementations that will become apparent upon reading this disclosure. Although the self-calibrating driver 100 shown and described above may be slew-rate limited, or limited by the current flow to the capacitive load 130, in some embodiments, a time-limited system, such as one limited by a RC (resistive-conductive) constant may also implement a one-time self-calibration similar to the disclosure above, for instance, fixing the current and varying the time.

The preceding embodiments are exemplary. Although the specification may refer to "an", "one", "another", or "some" embodiment(s) in several locations, this does not necessarily mean that each such reference is to the same embodiment(s), or that the feature only applies to a single embodiment.

What is claimed is:

1. A device comprising:
a variable current source configured to generate a default source current for charging a capacitive load;
a load charge calibrator configured to detect a voltage associated with the capacitive load when charged by the default source current, and configured to generate a current control feedback, wherein the current control feedback causes the variable current source to output a charge current capable of charging the capacitive load to a predetermined charged voltage of the capacitive load during a preset charging time, and wherein a level of the charge current is based on the detected voltage and the predetermined charged voltage, and wherein the preset charging time indicates a length of time that the variable current source is configured to deliver the charge current to the capacitive load; and
a calibration controller configured to indicate the predetermined charged voltage of the capacitive load to the load charge calibrator for use in calibrating the variable current source to charge the capacitive load to the predetermined charged voltage.

2. The device of claim 1, wherein the variable current source is operable to charge the capacitive load to the predetermined charged voltage with the charge current responsive to the current control feedback.

3. The device of claim 1, wherein the load charge calibrator comprises:
a voltage detector to detect the voltage associated with the capacitive load when charged by the default source current and to convert the detected voltage into a digital representation; and
a current controller for comparing the digital representation of the detected voltage with a digital representation of the predetermined charged voltage of the capacitive load and generate the current control feedback responsive to the comparison.

4. The device of claim 3, wherein the current controller divides the digital representation of the detected voltage by a digital representation of the predetermined charged voltage of the capacitive load to generate the current control feedback.

5. The device of claim 1, wherein the default source current is a minimum amount of current the variable current source is capable of generating.

6. The device of claim 1, further comprising:
a buffer to receive current from the variable current source for charging the capacitive load; and
the calibration controller to direct the buffer to charge the capacitive load for the preset charging time.

7. The device of claim 6, further comprising:
a first switch coupled between the load charge calibrator and the capacitive load, wherein the calibration controller activates the first switch allowing the load charge calibrator to detect the voltage associated with the charged capacitive load; and
a second switch coupled between ground and the capacitive load, wherein the calibration controller activates the second switch to discharge the capacitive load.

8. A method comprising:
generating a default source current for charging a capacitive load, wherein a variable current source generates the default source current;
indicating a predetermined charged voltage of the capacitive load for calibrating the variable current source to charge the capacitive load to the predetermined charged voltage;

charging the capacitive load with the default source current for a length of time indicated by a preset charging time;

detecting a voltage associated with the charged capacitive load; and generating a current control feedback according to the detected voltage and the predetermined charged voltage of the capacitive load, wherein the current control feedback causes the variable current source to output a charge current capable of charging the capacitive load to the predetermined charged voltage during the preset charging time, wherein a level of the charge current is based on the detected voltage and the desired charged voltage.

9. The method of claim 8, further comprising:

charging the capacitive load to the predetermined charged voltage according to the current control feedback.

10. The method of claim 8, further comprising:

converting the detected voltage into a digital representation;

comparing the digital representation of the detected voltage with a digital representation of the predetermined charged voltage of the capacitive load; and generating the current control feedback responsive to the comparison.

11. The method of claim 10, further comprising dividing the digital representation of the detected voltage by a digital representation of the predetermined charged voltage of the capacitive load to generate the current control feedback.

12. The method of claim 8, further comprising:

buffering current from the variable current source for charging the capacitive load;

directing the buffer to charge the capacitive load for the preset charging time.

13. The method of claim 12, further comprising:

activating a first switch allowing the load charge calibrator to detect the voltage associated with the charged capacitive load; and activating a second switch to discharge the capacitive load.

14. A system comprising:

means for generating a default source current for charging a capacitive load;

means for charging the capacitive load with the default source current means for detecting a voltage associated with the charged capacitive load;

means for generating a current control feedback, wherein the current control feedback causes the means for generating current to output a charge current capable of charging the capacitive load to a predetermined charged voltage of the capacitive load for a length of time indicated by a preset charging time, and wherein a level of the charge current is based on the detected voltage and the desired charged voltage; and means for indicating the predetermined charged voltage of the capacitive load to the means for generating current for use in generating the current control feedback.

15. The system of claim 14, further comprising means for charging the capacitive load to the predetermined charged voltage according to the current control feedback.

16. The system of claim 14, further comprising:

means for converting the detected voltage into a digital representation;

means for comparing the digital representation of the detected voltage with a digital representation of the predetermined charged voltage of the capacitive load; and means for generating the current control feedback responsive to the comparison.

17. The system of claim 16, further comprising:

means for dividing the digital representation of the detected voltage by a digital representation of the predetermined charged voltage of the capacitive load to generate the current control feedback.

18. The system of claim 14, wherein the default source current is a minimum amount of current the means for generating current is capable of generating.

19. The system of claim 14, further comprising:

means for buffering current from means for generating current;

means for directing the means for buffering to charge the capacitive load for the preset charging time.

20. The system of claim 19, further comprising:

means for activating a first switch allowing the load charge calibrator to detect the voltage associated with the charged capacitive load; and means for activating a second switch to discharge the capacitive load.

* * * * *